United States Patent

Namiki et al.

[11] Patent Number: 5,380,620
[45] Date of Patent: Jan. 10, 1995

[54] IMAGE-FORMING PROCESS

[75] Inventors: Tomizo Namiki; Tamotsu Suzuki; Fumiaki Shinozaki, all of Shizuoka, Japan

[73] Assignee: Fuji Photo Film Co., Ltd., Kanagawa, Japan

[21] Appl. No.: 204,448

[22] Filed: Mar. 2, 1994

[30] Foreign Application Priority Data

Mar. 2, 1993 [JP] Japan ................... 5-066120

[51] Int. Cl.⁶ ............................. G03C 11/12
[52] U.S. Cl. ..................... 430/257; 430/252; 430/253; 430/258
[58] Field of Search ........... 430/252, 253, 257, 258

[56] References Cited

U.S. PATENT DOCUMENTS

| | | | |
|---|---|---|---|
| 4,937,168 | 6/1990 | Platzer | 430/257 |
| 4,987,051 | 1/1991 | Taylor, Jr. | 430/258 |
| 5,176,981 | 1/1993 | Shinozaki et al. | 430/257 |
| 5,294,515 | 3/1994 | Wilczak et al. | 430/253 |

*Primary Examiner*—Hoa Van Le
*Attorney, Agent, or Firm*—Sughrue, Mion, Zinn, Macpeak & Seas

[57] ABSTRACT

An image-forming process comprises the steps of: forming an ink-receiving area and an ink-repelling area on a light-sensitive material by imagewise exposure; pressing on the ink-receiving area and ink-repelling area of the material an ink sheet comprising a support and an ink layer composed of a colorant and a polymer binder; removing the ink sheet from the material so that the ink layer of the ink sheet is transferred only onto the ink-receiving area of the material; pressing an image receiving sheet on the ink-receiving area having the ink layer and the ink-repelling layer of the material; and separating the image receiving sheet from the material so that the ink layer in the ink-receiving area is transferred onto the image receiving sheet. A similar image-forming process using a resist ink sheet is also disclosed.

12 Claims, 1 Drawing Sheet

IMAGE-FORMING PROCESS

FIELD OF THE INVENTION

This invention relates to an image-forming process. In more detail, the invention relates to an image-forming process advantageously employable for preparing a color proofing sheet for use in proofing of color printing, and particularly employable for preparing many color proofing sheets with simple procedures. Further, the invention relates to an image-forming process particularly suitable for preparing, in clean circumstances, a highly precise pattern required in the field of electronics technology.

PRIOR ART

In the field of color image printing industry, color proofing is generally carried out before the actual printing is performed in order to adjust tone and quality of the desired color image. A proof sheet can be prepared by means of a printing machine. However, the color proofing using a printing machine requires not only a lot of works and time but also high skill. Further, the reliability of such color proofing procedure is not sufficiently high.

Instead of the above printing process, various photographic processes have been proposed for color proofing. One of such photographic processes uses photopolymer (namely, pre-press proof), and this process is generally called "color proofing process". There are two known types of color proofing processes: that is, the overlay type and the surprint type. Each type of the color proofing process is chosen depending on the desired image quality and/or the desired procedure.

The overlay type process is, for example, disclosed in U.S. Pat. No. 3,136,637. In this overlay type proofing system, a plural number of colored proofing sheets on each of which a respective color separation image has been formed are superposed one on another on a transparent film to adjust colors.

In the surprint type of color proofing process, light-sensitive layers (on each of which a respective color separation image can be successively formed) are superposed one on another on a single support. The formation of color image can be carried out either by simply transferring a colored layer or by using a powdered color toner. U.S. Pat. Nos. 3,060,023, 3,060,024, 3,060,025, 3,481,736, etc. discloses examples of color proofing processes using photopolymerization and thermal transfer techniques. Further, U.S. Pat. No. 4,304,836 and Japanese Patent Provisional Publication No. 59(1984)-97140 disclose color proofing systems applicable for both the overlay type process and the surprint type process. The color proof sheet obtained by the surprint type process is more similar to the color image obtained by the actual printing process than that of the overlay type process.

As described above, various proofing systems have been studied. However, there arises a common problem in the above-mentioned photographic color proofing processes when a lot of proof sheets are to be produced from one original. In the conventional process using the printing machine, the required time and cost for producing a number of proofing sheets are nearly the same as those for a single sheet. On the other hand, in the photographic color proofing process, all the procedures such as exposing, developing and transferring are time-consuming, and increased time and cost in proportion to the required number of the proof sheets are needed. Therefore, in such case, plural color proof sheet cannot be easily obtained by the photographic color proofing processes.

In the field of electronics device producing industry, technology for preparing a printing plate (namely, photolithography) has contributueed to the development of semiconductor manufacturing technology. The optical patterning process was introduced in an early period, and light-sensitive coal tar or natural polymers were used. In the 1950s, Eastman Kodak proposed KPR comprising cinnamyl cinnamate instead of the unstable natural polymers, and was introduced into the process for making a printing plate, that is, the photomechanical process. Due to its advantageous performance, the phtomechamocal process has been used for production of transistors and diodes. Since then, light-sensitive materials having excellent characteristics have been studied, and the photolithography technology has been developed. At the present time, very fine semiconductor devices are prepared based on the photolithography technology.

As for the printing process to be performed after the production of the printing plate, it is known that the printing technique are used only for producing circuit printed boards and thick film devices. Such production does not require precise patterns, as compared with the production of very fine semiconductor devices. Because the screen printing and the offset printing (using lithography or relief plate) provide very poor patterns, as compared with the photolithography, the printing process cannot be used for making precise patterns. The printing process can be carried out at a very low cost, and therefore various attempts to make fine lines by the printing process have been made for a long time. However, favorable results have not been obtained. Although there is a report in which a line of 20–30 $\mu m$ width was formed under specific conditions, the lines formed in a practical system are generally those of about 100 $\mu m$ width. Therefore, photolithography is still used generally even though it is disadvantageous from the viewpoint of cost.

If the printing process is improved to give very fine patterns, it would be widely used replacing the expensive photoprocess. The producing cost can be lowered by utilizing a small device in the printing process or exposing a large area in the production of LSI. However, for the production of large devices (e.g., liquid crystal panels), the cost cannot be lowered by utilizing the printing process. Therefore, a new technique which gives a breakthrough is desired.

Further,the conventional printing process have the following drawbacks:

(1) it is difficult to give fine lines,
(2) it is difficult to give lines having uniform width (undesired line-breaking and line-connecting are produced),
(3) pin holes are formed (that is, white holes and black holes),
(4) it is difficult to precisely position the pattern, and
(5) dust adheres to the pattern.

More details of the drawbacks are described below.

First of all, production of emulsified ink and bubbles contained in the ink cause the problems.

In lithographic printing process, the ink is kept from adhering onto non-printing area using water. Therefore, water is supplied to the printing plate. The supplied water is apt to be reversely moved to the ink-supplying system to emulsify the ink. As the image reproductivity of emulsified ink is generally lowered, this is particularly disadvantageous in producing a fine image. Particularly in continuous printing system, this phenomenon cannot be ignored. Recently, however, this emulsifying phenomenon has been solved by the non-water offset printing system using an oil-repellent printing plate (e.g., silicone resin plate).

Bubbles are contained in any viscous ink. Therefore, there is no measure to obviate such troubles, so long as viscous ink is used. In more detail, the kneading process is necessary in the use of viscous ink. Air is introduced in the form of bubbles in the kneading process, and the bubbles remain in the ink throughout the process. Since the bubbles decrease the amount of the ink transferred onto printing area, various troubles such as pin holes, undesired line-breaking and roughness of image edge are caused. Further, bubbles are formed in the ink throughout the process, such as inking onto the plate, transferring onto blanket and transferring to the aimed material, and further bubbles are formed in the ink in all part of the system such as ink-pan and kneading roller. If the whole system is set in vacuum, bubbles are not formed. However, even in such case, the ink must be degassed by placing the ink in vacuum before procedures are started. It is very difficult to degas high viscous ink, and the solvent of the ink is evaporated and likely deteriorated in the degassing process. Therefore, it is not practical.

The second problem resides in deformation of the ink image. In printing process, ink is sufficiently kneaded by means of plural ink rollers for forming homogeneous ink and then placed onto the printing area (that is, ink-receiving area) of the plate. The ink placed on the plate is then transferred onto a blanket for offset printing by pressing. In this step, the viscous ink phase as well as the blanket are deformed by the pressure. Therefore, the printing image is likely deformed and the position of the image is apt to drift. The deformation cannot be ignored because the printing area of ink-receiving area of the plate should be prepared very precisely. The ink transferring process functions depending on difference of ink affinity between the plate and the ink-blanket. If the ink affinity to the plate is stronger than that to the blanket, ink is not transferred onto the blanket or only a small amount of the ink is transferred. In such case, a clear image cannot be formed. Therefore, the ink affinity to the blanket must be stronger than that to the plate. This transferring mechanism is the same in the following step in which the ink is transferred onto the non-printing area. Consequently, the quality of formed image depends on the deformation by pressure described above and the affinity (ink-acceptability) of the blanket.

The third problem resides in poor alignment in the use of printing machines.

SUMMARY OF THE INVENTION

An object of the present invention is to provide an image-forming process by which many color proof sheets can be easily prepared.

Another object of the invention is to provide an image-forming process by which many precise patterns can be printed in clean circumstances with high reproducibility.

A further object of the invention is to provide an image-forming process in which the problems described above are not observed.

In the desired process, image reproductivity is not deteriorated by bubbles formed in ink in the kneading step and/or by emulsifying of ink, and efficiency of ink transferring is improved. Therefore, a highly precise pattern image (e.g., resist image) can be reliably printed in clean circumstances by such process. Such process is very useful for producing dot-memory having large capacity (e.g., optical card ROM, large scale data memory sheet and magnetic ROM), very fine circuit resist printing (e.g., high density TAB), high quality microprinting, photographic printing (e.g., 1000 lines printing), large scale flat panel display, two-dimensional sensor and large scale IC memory (e.g., ROM and RAM).

In the first embodiment of the present invention, there is provided an image-forming process comprising the steps of:

forming an ink-receiving area and an ink-repelling area on a light-sensitive material by imagewise exposing the material to actinic light or by imagewise exposing the material to actinic light and developing the exposed material (step Ia);

placing under pressure on the ink-receiving area and ink-repelling area of the material an ink sheet comprising a support and an ink layer composed of a colorant and a polymer binder under the condition that the ink layer is brought into contact with the ink-receiving area and the ink-repelling area of the material (step IIa);

removing the ink sheet from the material so that the ink layer of the ink sheet is transferred only onto the ink-receiving area of the material (step IIIa);

placing under pressure an image receiving sheet on the ink-receiving area having the ink layer therein and the ink-repelling layer of the material (step IVa); and separating the image receiving sheet from the material so that the ink layer in the ink-receiving area is transferred onto the image receiving sheet (step Va).

In the second embodiment of the invention, there is provided an image-forming process comprising the steps of:

forming a resist ink-receiving area and a resist ink-repelling area on a light-sensitive material by imagewise exposing the material to actinic light or by imagewise exposing the material to actinic light and developing the exposed material (step Ib);

placing under pressure on the resist ink-receiving area and resist ink-repelling area of the material a resist ink sheet comprising a support and an resist ink layer under the condition that the resist ink layer is brought into contact with the resist ink-receiving area and the resist ink-repelling area of the material (step IIb);

removing the resist ink sheet from the material so that the resist ink layer of the resist ink sheet is transferred only onto the resist ink-receiving area of the material (step IIIb);

placing under pressure an image receiving sheet on the resist ink-receiving area having therein the resist ink layer and the resist ink-repelling layer of the material (step IVb);

exposing the image receiving sheet and the material to actinic light so that the resist ink layer on the resist ink-receiving area is hardened (step Vb); and separating the image receiving sheet from the material so that an image of the hardened resist ink is formed on the image receiving sheet (step VIb).

DETAILED DESCRIPTION OF THE INVENTION

The first embodiment of the invention is described below.

In performing the first embodiment, a light-sensitive material, an ink sheet, and an image-receiving sheet are prepared.

The light-sensitive material used in the first embodiment is a material on which both ink-receiving area and ink-repelling area can be formed thereon by exposure to actinic light or by a combination of the exposure and development.

Typical light-sensitive materials employable in the invention are shown in attached drawings.

Figure 1A:
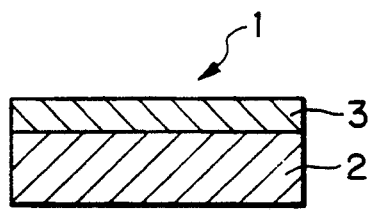
FIG. 1, (A) shows a schematic cross section of an example of the light-sensitive material used in the invention, and (B) shows a schematic cross section of the material on which an ink-receiving area and an ink-repelling area are formed.
Figure 1B:
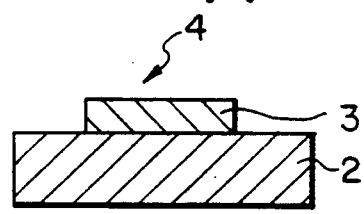

FIG. 1, (A) shows a schematic cross section of a light-sensitive material 1 which consists of a support 2 having an ink-repellent surface and a light-sensitive layer 3 having an ink-receiving surface (which has affinity for ink). After the exposure and, if required, development, the light-sensitive material 1 of (A) is converted to the material 4 of (B) having an ink-repelling area (corresponding to the surface of the support 2) and an ink-receiving area (corresponding to the surface of the layer 3).

Figure 2A:
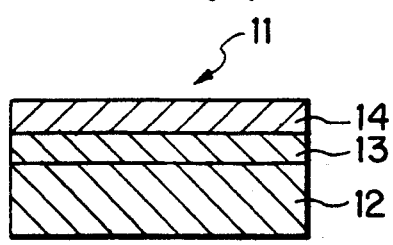
FIG. 2, (A) shows a schematic cross section of another example of the light-sensitive material used in the invention, and (B) shows a schematic cross section of the material on which an ink-receiving area and an ink-repelling area are formed.
Figure 2B:
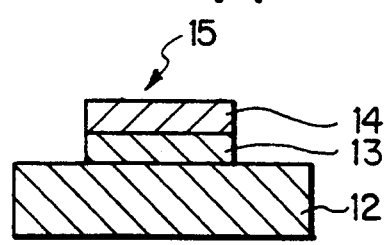

FIG. 2, (A) shows a schematic cross section of a light-sensitive material 11 which consists of a support 12 having an ink-receiving surface, a light-sensitive layer 13, and a coating layer 14 having an ink-repellent surface. After the exposure and, if required, development, the light sensitive material 11 of (A) is converted to the material 15 of (B) having an ink-receiving area (corresponding to the surface of the support 12) and an ink-repelling area (corresponding to the surface of the coating layer 14).

Figure 3A:
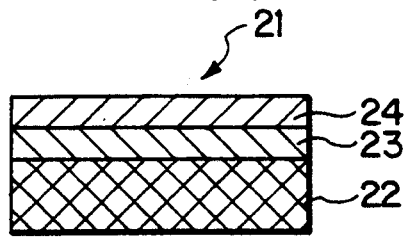
FIG. 3, (A) shows a schematic cross section of a further example of the light-sensitive material used in the invention, and (B) shows a schematic cross section of the material on which an ink-receiving area and an ink-repelling area are formed.
Figure 3B:
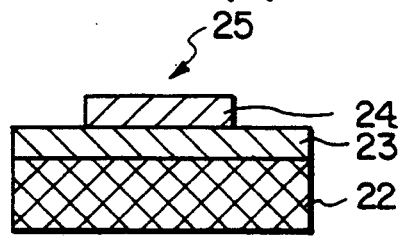

FIG. 3, (A) shows a schematic cross section of a light-sensitive material 21 which consists of a support 22, a subbing layer 23 having an ink-repellent surface, and a light-sensitive layer 24 having an ink-receiving surface. After the exposure and, if required, development, the light sensitive material 21 of (A) is converted to the material 25 of (B) having an ink-repelling area (corresponding to the surface of the subbing layer 23) and an ink-receiving area (corresponding to the surface of the layer 24).

Figure 4A:
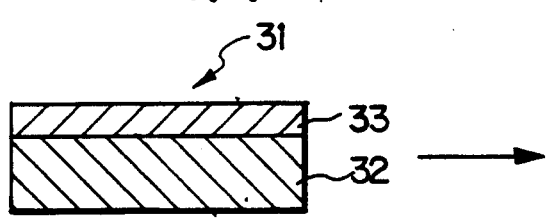
FIG. 4, (A) shows a schematic cross section of a still further example of the light-sensitive material used in the invention, and (B) shows a schematic cross section of the material on which an ink-receiving area and an ink-repelling area are formed.
Figure 4B:
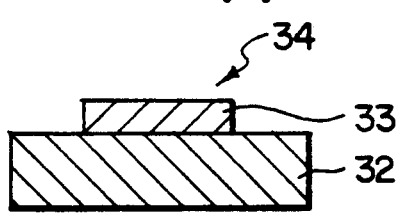

FIG. 4, (A) shows a schematic cross section of a light-sensitive material 31 which consists of a support 32 having an ink-receiving surface and a light-sensitive layer 33 having an ink-repellent surface. After the exposure and, if required, development, the light-sensitive material 31 of (A) is converted to the material 34 of (B) having an ink-receiving area (corresponding to the surface of the support 32) and an ink-repelling area (corresponding to the surface of the layer 33).

Figure 5A:
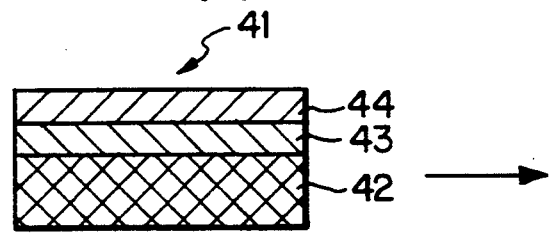
FIG. 5, (A) shows a schematic cross section of a still further example of the light-sensitive material used in the invention, and (B) shows a schematic cross section of the material on which an ink-receiving area and an ink-repelling area are formed.
Figure 5B:
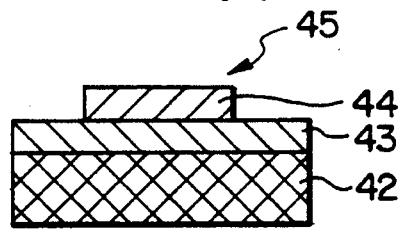

FIG. 5, (A) shows a schematic cross section of a light-sensitive material 41 which consists of a support 42, a subbing layer 43 having an ink-receiving surface, and a light-sensitive layer 44 having an ink-repellent surface. After the exposure and, if required, development, the light sensitive material 41 of (A) is converted to the material 45 of (B) having an ink-receiving area (corresponding to the surface of the subbing layer 43) and an ink-repelling area (corresponding to the surface of the layer 44).

As described above, the light-sensitive material has at least a support and a light-sensitive layer, and optionally has an additional ink-receiving layer or an ink-repelling layer. The support may be ink-receiving or ink-repelling, and the light-sensitive layer may be ink-receiving or ink-repelling. The ink-repelling area and ink-receiving area can be formed on the light-sensitive material by suitably setting the exposing and developing conditions.

The support is not particularly restricted, and generally takes a form of film or sheet. The support may be made of any material, but preferably it should be stable against heat, chemicals and light. Examples of the materials of the ink-receiving support include polymer materials such as polyethylene terephthalate (PET), polycarbonate, polystyrene, cellulose acetate, polyvinyl chloride, poly(vinylidene chloride), polyimide, and styrene-acrylonitrile copolymer. Particularly, biaxially oriented polyethylene terephthalate is preferred from the viewpoint of strength, dimensional stability, thermostability and transparency. In some cases, glass plates or metal plates can be used as the ink-receiving support. Examples of the materials of the ink-repelling support include silicone rubber, fluoro-resin (fluorine-containing resin), and polyolefin such as polyethylene and polypropylene. Oil-repelling materials such as silicone oil, fluorine-containing surfactants, fluorine-containing compounds and fluorine-containing waxes may be included in the support, or the surface of the support may be coated with such oil-repelling materials so that the support can become ink-repelling. In the case that the support forms neither the ink-repelling area nor the ink-receiving area as shown in FIG. 3 and FIG. 5, both ink-repelling materials and ink-receiving materials are employable as the support.

The thickness of the film type support generally is in the range of 10–400 μm, preferably 25–200 μm. The support preferably is transparent for actinic light.

If the support forms neither the ink-repelling area nor the ink-receiving area, a subbing layer should be provided on the surface of the light-sensitive layer side of the support or the surface of the light-sensitive layer may be physically coated. An appropriate polymer material which can form a film can be employed for the preparation of the subbing layer and the coating layer. The material is selected from the viewpoint of compatibility with other layers. The thickness of the subbing layer or coating layer is not restricted, but generally in the range of 0.01-2 μm. It is also preferred that the surface of the light-sensitive layer side of the support be subjected to physical surface treatment such as glow-discharge treatment and corona-discharge treatment.

The light-sensitive layer may contain material which is changed from "soluble" in a developing solution to "insoluble" or from "insoluble" to "soluble" by exposing to actinic light. As described above, the light-sensitive layer which is kept on the light-sensitive material after exposure or after development is ink-receiving or ink-repelling. The material for the light-sensitive layer is not restricted, so long as it has the above-mentioned characteristics. Preferred example is light-sensitive photoresist material which is treated in an alkaline developing solution.

Examples of a positive working light-sensitive material include a light-sensitive resin composition containing o-quinonediazide. Also employable are light-sensitive resin compositions disclosed in Japanese Patent Publication No. 56(1981)-2696, Japanese Patent Provisional Publications No. 48(1973)-89003, No. 51(1976)-120714, No. 53(1978)-133429, No. 55(1980)-12995, No. 55(1980)-126236, No. 56(1981)-17345, and No. 61(1986)-166544.

Examples of a negative working light-sensitive material include a mixed composition of azide type light-sensitive material such as 2,6-di(4-azidebenzal)cyclohexane and phenolnovolak resin. Preferably used is a photopolymerizable light-sensitive composition containing a copolymer of benzyl methacrylate and methacrylic acid (e.g., that of molar ratio 7:3) as a binder, multi-functional monomer such as trimethylol propanetriacrylate and a photopolymerization initiator such as Michler's ketone.

For developing the light-sensitive materials, aqueous alkaline developers such as sodium hydroxide, sodium silicate, potassium silicate, trisodium phosphate, tripotassium phosphate, sodium carbonate, potassium carbonate and triethanolamine can be employed. A small amount of a surfactant and an organic solvent can be added to the developing solution in order to improve wettability and to shorten the developing time. On the light-sensitive material shown in FIG. 2 (A), an ink-repelling coating layer 14 consisting of non light-sensitive material such as silicone rubber or fluorine-containing resin is provided as the top layer. In developing process after exposure, a soluble portion of the layer 13 is washed out with the developing solution. At the same time, a part of the ink-repelling coating layer 14 (in the area superposed on the washed out area of the layer 3 is removed together with the the washed out portion of the layer 13. Since the ink-repelling coating layer 14 is insoluble in the developing solution, the coating layer 14 preferably can swell in the developing process so that the developing solution can penetrate through the coating layer 14 to the layer 13. Therefore, it is preferred that the developing solution contain an organic solvent as disclosed in Japanese Patent Publications No. 42(1967)-21879, No. 46(1971)-16044 and No. 55(1980)-22781, and Japanese Patent Provisional Publications No. 49(1974)-86103 and No. 49(1976)-68803. Particularly preferred is an aqueous developing solution containing a small amount of an organic solvent. Such developing solution is disclosed in Japanese Patent Provisional Publications No. 1(1989)-159644 and No. 3(1992)-231752. Japanese Patent Publications No. 54(1979)-26932, No. 56(1971)-23150, and No. 55(1980)-12861 disclose another type of the light-sensitive material in which an ink-repelling layer is provided on the light-sensitive layer. In that light-sensitive material, an exposed area is photochemically fixed on the the light-sensitive layer and then the non-exposed area of silicone rubber layer is swelled and removed.

A photopolymerizable light-sensitive material preferably used for the light-sensitive layer comprises:
  (a) at least one photopolymerizable monomer and/or oligomer capable of forming a photopolymer by addition polymerization;
  (b) at least one organic polymer binder; and
  (c) a photopolymerization initiator activated by actinic light; and if desired or necessary, additives such as a thermalpolymerization inhibitor and surfactant.

The above-described photopolymerizable monomer and/or oligomer (hereinafter, such monomer and/or oligomer is occasionally referred to simply as photopolymerizable monomer) is not restricted so long as it can form a photopolymer by addition polymerization. The photopolymerizable compounds preferably are multifunctional vinyl or vinylidene compounds.

Examples of the compounds include unsaturated esters of polyols (preferably acrylates or methacrylates of polyols) such as ethylene glycol diacrylate, glycerol triacrylate, ethylene glycol dimethacrylate, 1,3-propanediol dimethacrylate, polyethylene glycol dimethacrylate, 1,2,4-butanetriol trimethacrylate, trimethylol ethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate, bisacrylate or bismethacrylate of polyethylene glycol having molecular weight of 200 to 400, and the compounds analogous to these compounds. Unsaturated amides can be also employed. Preferred examples of the amides include unsaturated amides of acrylic acid or methacrylic acid having $\alpha,\omega$-diamines such as ethylene bismethacrylamide and ethylene bisacrylamide. The alkylene chain of the amides may be interrupted by an oxygen atom. Further, polyester acrylates prepared by condensation of (meth-)acrylic acid and an ester derived from a polyhydric alcohol and a multivalent organic acid.

Preferable material of the organic polymer binder as described above are thermoplastic polymers and their mixtures. Examples of the organic polymer binders include homopolymer and copolymer of acrylic monomers such as acrylic acid, methacrylic acid, acrylate ester and methacrylate ester; cellulose polymers such as methyl cellulose, ethyl cellulose and cellulose acetate; vinyl polymers such as polystyrene, polyvinyl chloride, vinyl chloridevinyl acetate copolymer, poly(vinyl pyrrolidone), poly(vinyl butyral) and poly(vinyl alcohol); condensed polymers such as polyester and polyamide; and polyolefins such as chlorinated polystyrene and chlorinated polypropylene. Copolymers of acrylic monomers are preferred, since their thermal properties such as softening point are easily controlled and they are compatible with photopolymerizable monomers. The polymer preferably has a number-average molecular weight of 10,000-2,000,000. The mixing ratio between the photopolymerizable monomer and the organic polymer binder depends on their combination, but generally it is in the range of 0.1:1.0–2.0:1.0 (photopolymerizable monomer:binder by weight).

The initiator preferably is a compound showing small absorption within a visible region. Examples of the initiators include aromatic ketones such as benzophenone, Michler's ketone (4,4'-bis(dimethylamino)benzophenone), 4,4'-bis(diethylamino)benzophenone, 4-methoxy-4'-dimethylaminobenzophenone, 2-ethylanthraquinone, phenanthraquinone, and other aromatic ketones; benzoyl; benzoin ethers such as benzoin methyl ether, benzoin ethyl ether and benzoin phenyl ether; benzoins such as methylbenzoin and ethylbenzoin; and 2,4,5-triarylimidazole dimers such as 2-(o-chlorophenyl)-4,5-diphenylimidazole dimer, 2-(o-chlorophenyl)-4,5 -di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-dimethoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer and dimers described in U.S. Pat. Nos. 3,476,185 and 3,784,557, and British Patent No. 1,047,569.

The photopolymerization initiator is generally contained in the range of 0.01–30 wt. % based on the amount of the photopolymerizable monomer.

The light-sensitive layer may contain a thermal polymerization inhibitor. Examples of the thermal polymerization inhibitor include hydroquinone, p-methoxyphenol, alkyl or aryl-substituted hydroquinone, t-butylcatechol, pyrogallol, naphthylamine and $\beta$-naphthol.

The light-sensitive layer may further contain a plasticizer, a solvent, a surfactant, and an inert filler.

In the case that ink-repelling area is formed on the light-sensitive layer after exposing to actinic light or by development after such exposure, releasing agents of silicone type or fluorine type can be contained in the above-described materials used for the the light-sensitive layer on which the ink-receiving area is formed. Preferred example of silicone type releasing agent is silicone oil. Examples of the silicone oil include dimethylsilicone oil, dimethylphenylsilicone oil, cyclic dimethylpolysiloxane, alkyl-modified silicone oil, polyether-modified silicone oil, alcohol-modified silicone oil, carboxyl-modified silicone oil, and higher fatty acid-modified silicone oil. Preferred examples of the fluorine type releasing agents include an oligomer having perfluoroalkyl group and a perfluoroalkyl phosphate ester. Once added into resin, such material immediately migrates to the interface and then orientates in such manner as the perfluoro alkyl group to outside and the resin-compatible part into resin-side. The ink-repelling material may be contained in the materials used for the the light-sensitive layer on which ink-receiving area is formed, so that ink-repelling area may be formed by exposing to actinic light or by development after such exposure. Examples of such ink-repelling material include silicone rubber, fluorine-containing resin, releasing fluorine-containing surfactant, polyolefinic resin (e.g., polyethylene and polypropylene), copolymer of such olefin and $\alpha$, $\beta$-unsaturated carboxylic acid, and ionomer resin of the copolymer and metal ion.

The amount of the releasing agent (including the ink-repelling material) contained in the light-sensitive layer depends on various conditions such as composition of the light-sensitive layer, characteristics of the releasing agent, constitution of the light-sensitive material and constitution of the ink sheet. In any case, the releasing agent must be contained in an enough amount for giving ink-repelling characteristics to the material used for the light-sensitive layer on which ink-receiving area is formed. Generally, the releasing agent is contained in an amount of 0.01–100 wt. % based on the amount of the solid component.

The light-sensitive layer can be formed on a support in a known manner. For example, a coating dispersion containing the above-mentioned components is coated on the support, the ink-receiving subbing layer, or the ink-repelling subbing layer, and then coated layer is dried to form the light-sensitive layer. The thickness of the light-sensitive layer is within the range of about 0.1–100 $\mu$m, preferably 1–50 $\mu$m.

The ink-repelling layer may be provided on the light-sensitive material. Examples of the material for the ink-repelling layer include silicone rubber, fluorine-containing resin, a fluorine-containing surfactant, polyolefinic resin (e.g., polyethylene and polypropylene), copolymer of such olefin and $\alpha$, $\beta$-unsaturated carboxylic acid and ionomer resin of the copolymer and metal ion. Silicone rubber is the most preferred, because it has very low surface energy. These materials can be used singly or in combination.

Linear or partially crosslinked organopolysiloxane is preferably used. The molecular weight of organopolysiloxane is usually in the order of $10^3$–$10^5$. The form of organopolysiloxane (liquid, wax or paste) is determined by the extent of crosslinking. Organopolysiloxane is classified into condensation type and addition type according to the crosslinking reaction.

The condensation type silicone rubber is produced by removing water, alcohol or organic acid produced in the condensation reaction. Particularly employable condensation type silicone rubber is a mixture of a silicone cross-linking agent and linear organopolysiloxane having hydroxyl group at both terminal or at a part of main chain. The linear organopolysiloxane having hydroxyl group which is crosslinked with silicone cross-linking agent is also employable.

As for the addition type silicone rubber, crosslinking is caused by hydroxyl group of the crosslinking agent. Such hydroxyl group reacts with unsaturated group such as vinyl group of the starting organopolysiloxane to cause crosslinking. The addition type silicone rubber can be formed from organopolysiloxane having vinyl group or organopolysiloxane hydride in the presence of a platinum catalyst.

The above silicone rubber is commercially available. Examples of commercially available silicone rubbers include KE-41 and KE-42 (available from Shin-Etsu Chemical Co., Ltd.), YE-3085 and YE-3057 (Toshiba Silicone Co., Ltd.), SH-781 and PRX-305 (Toray Silicone Co., Ltd.) [condensation type]; and KE-103 and KE-1300 (Shin-Etsu Chemical Co., Ltd.), TSE-3032 (Toshiba Silicone Co., Ltd.), and SH-9555 (Toray Silicone Co., Ltd.) [addition type].

A silicone rubber layer can be formed as the ink-repelling layer by the process for preparing a silicone rubber layer of nonaqueous lithographic plate. Such process is, for example, disclosed in Japanese Patent Publications No. 55(1980)-22781, No. 55(1980)-39826, No. 55(1980)-47383 and No. 55(1980)-39825, Japanese Patent Provisional Publications No. 49(1974)-68803, No. 49(1974)-73202, No. 49(1974)-77702, No. 60(1985)-133452, No. 60(1985)-133453, No.

60(1985)-169852, No. 60(1985)-229031, No.
61(1986)-153655, No. 62(1987)-14155, No.
62(1987)-14156, No. 62(1987)-50760, No.
62(1987)-112162, No. 61(1986)-275759, No.
62(1987)-175759, No. 62(1987)-177559, No.
62(1987)-194255, No. 62(1987)-299854, No.
62(1987)-111254, No. 63(1988)-133153, No.
63(1988)-200155, No. 63(1988)-253949, No.
63(1988)-261352, No. 63(1988)-280250, No.
63(1988)-280251, No. 63(1988)-305360, No.
01(1989)-35547, No. 01(1989)-118843, No.
01(1989)-159653, No. 01(1989)-172834, No.
01(1989)-179047, No. 01(1989)-214839, No.
01(1989)-235955, No. 01(1989)-235956, No.
01(1989)-237663, No. 01(1989)-237664, No.
01(1989)-257847, No. 01(1989)-297643, No.
02(1990)-34857, No. 02(1990)-79852, No.
02(1990)-216157, No. 02(1990)-220059, No.
02(1990)-220060, No. 02(1990)-226248, No.
02(1990)-226249, No. 02(1990)-235064, No.
02(1990)-236550, No. 02(1990)-242255, No.
03(1991)-5756, No. 03(1991)-27043, No. 48(1973)-94503,
No. 48(1973)-94504, No. 49(1974)-88607, No.
50(1975)-50102, No. 50(1975)-59102, No.
50(1975)-59103, No. 50(1975)-66304, No. 51(1976)-8003,
No. 51(1976)-70004, No. 54(1979)-18305, No.
54(1979)-54702, No. 54(1979)-89805, No.
54(1979)-103103, No. 54(1979)-130203, No.
55(1980)-26576, No. 55(1980)-26577, No.
55(1980)-55343, No. 55(1980)-59466, No.
55(1980)-60947, No. 55(1980)-70846, No.
55(1980)-84939, No. 55(1980)-89842, No.
55(1980)-110249, No. 55(1980)-124149, No.
55(1980)-156947, No. 55(1980)-161244, No.
55(1980)-159441, No. 56(1981)-25740, No.
56(1981)-27150, No. 56(1981)-43642, No.
56(1981)-62253, No. 56(1981)-80046, No.
56(1981)-80047, No. 57(1982)-13448, No.
57(1982)-23941, No. 57(1982)-124734 and No.
57(1982)-129442.

The thickness of the silicone rubber layer depends on the aimed image. For example, in the case of transferring several ink sheets to prepare a color proofing sheet, the thickness is preferably set at about 0.5 μm. Such thickness gives high developability. The thicker the silicone rubber layer is made, the worse the developability of image generally becomes. Therefore, if the silicone rubber layer is made thick, the obtained image shows low resolving power. The thickness of the silicone rubber layer is preferably set at not more than 3.0 μm.

Examples of fluorine-containing resin include LUMIFLUONE and SAITOP (Trade name, available from Asahi Glass Co., Ltd.). As SAITOP, a soluble perfluoro resin, can be applied for coating in the form of solution, and it is preferably used. Preferred examples of fluorine-containing surfactant are oligomers having perfluoroalkyl group. Examples of such oligomers include DIFENZA MCF-300, MCF-312 and MCF-323 (Trade name, available from Dainippon Ink & Chemicals Inc.). Also available are releasing agents of fluorine type, DAIFREE MS-443, MS-543 and MS-743 (Trade name, available from Daikin Kogyo Co., Ltd.).

Preferred examples of fluorine type releasing agents include an oligomer having perfluoro alkyl group, hydrophilic group and hydrophobic group; urethane having perfluoroalkyl group and hydrophobic group; and perfluoro alkyl phosphate ester.

The ink-repelling layer is generally formed in the following manner. If the resin can form film by itself, a coating solution containing the resin is coated by means of, for example, a spin coater. If the material cannot form film by itself (e.g., fluorine-containing surfactant), the material is generally used with a film-forming resin.

Examples of the polymerizable monomers to form polyolefin include ethylene, propylene, 1-butene, 1-pentene, 1-hexene, 1-octene and iso-butylene. Polymerizable monomer of α, β-unsaturated carboxylic acid is copolymerized with such olefin. Examples of such carboxylic acid include a compound having 2–8 carbon atoms such as acrylic acid, methacrylic acid, α-ethylacrylic acid, maleic acid and itaconic acid. Examples of the metal ion crosslinking such copolymers include ions of alkali metals such as lithium, sodium and potassium, zinc and magnesium.

The ink-repelling layer can be made of the above-mentioned copolymer of olefin and α, β-unsaturated carboxylic acid; and ionomer resin of said copolymer and metal ion. In such case, the ink-repelling layer is generally formed by applying a coating solution or a coating aqueous dispersion containing the above-described resin by means of, for example, a spin coater.

A cover film (protective film) may be provided on the top surface (the reverse surface of the support) in order to protect the surface on which ink-receiving area and ink-repelling area are formed. In some cases, the protective film reduces polymerization-inhibiting effect of air in exposing procedure. Examples of the materials for the protective film include polyethylene terephthalate (PET), polycarbonate, polyethylene, polypropylene, polyvinyl chloride, poly(vinylidene chloride), polystyrene, and styrene-acrylonitrile copolymer. Polyethylene, polypropylene and polyethylene terephthalate are preferably used. The thickness of the protective film preferably is in the range of 5–400 μm, more preferably 10–200 μm.

There is a case that the ink-receiving area and ink-repelling area can be formed only by exposure. Examples of such material include a salt of diazonium cation and a low adhesive anion having perfluorocarbon disclosed in Japanese Patent Provisional Publication No. 51(1976)-141003, a fluorine-containing diazo compound disclosed in Japanese Patent Provisional Publication No. 54(1979)-79034, and 2-diazo-1,2-quinone derivative substituted by a fluorine-substituted alkyl group.

The ink sheet used is a sheet comprising a support and an ink layer provided thereon which contains a colorant (dye or pigment) and a polymer binder.

The support is not particularly restricted, and it may be made of any material. Examples of the materials of the support include polymer materials such as polyethylene terephthalate (PET), polycarbonate, triacetyl cellulose, polyethylene, polypropylene, polyvinyl chloride, poly(vinylidene chloride), polystyrene, and styrene-acrylonitrile copolymer. Particularly, biaxially oriented polyethylene terephthalate is preferred from the viewpoint of strength, dimensional stability, and thermostability. The thickness of the support generally is in the range of 5–400 μm, preferably 10–200 μm.

A undercoating layer may be provided on the surface of the ink layer side of the support in order to enhance or weaken adhesion between the support and the ink layer. Said surface may be physically or chemically coated for the same purpose. A film-forming polymer material can be used for the undercoating layer. The material is selected from the viewpoint of compatibility with other layers. If the adhesion between the support and the ink layer is desired to be weakened, silicone resin such as poly(dimethylsiloxane), fluorine-containing resin, gelatin and a water-soluble polymer such as polyvinyl alcohol are used. Further, it is also effective to add a fluorine-containing surfactant into the undercoating layer. If the adhesion between the support and the ink layer is desired to be enhanced, the surface of the ink layer side of the support is preferably subjected to physical surface treatment such as glow-discharge treatment and corona-discharge treatment or chemical surface treatment with a silane coupling agent.

If the undercoating layer works as cushion, the efficiency of transferring of the ink layer is enhanced. The material of such undercoating layer is preferably selected from organic polymers each of which softening point is not higher than 80° C. The softening point is determined by Vicat method (method for measuring polymer softening point defined in ASTM D 1235). Examples of such polymer include polyolefin such as polyethylene and polypropylene; ethylene copolymers such as copolymers of ethylene-vinyl acetate, ethylene-acrylic acid, ethylene-acrylate ester and ethylene-$\alpha,\beta$-unsaturated carboxylic acid; polyvinyl chloride, copolymer of vinyl chloride and vinyl acetate; nylon; polyamide resin; and synthetic rubber. Also employable is any of known organic polymers each of which has a softening point of not higher than 80° C. The thickness of the undercoating layer is not restricted. Generally, the thickness is set in the range of 0.01-5 μm for the purpose of adjusting the adhesion. If the undercoating layer is made to work as cushion, the thickness is generally set in the range of 1-500 μm.

The ink layer contains at least one kind of coloring matter (colorant) and a polymer binder. The ink layer can be formed in a known manner. For example, generally a coloring matter, a binder, and if desired, components described below are dissolved and/or dispersed in a solvent to prepare a coating composition. The prepared composition is coated and dried onto the support to form the ink layer.

The coloring matters (colorants) contained in the ink layer are either pigments or dyes. Pigments are generally classified into organic pigments and inorganic pigments. The former forms a film of high transparency, and the latter gives a film of high shielding power. Pigments and dyes for particular use in color proofing have yellow, magenta, cyan, and black tone, as are required in color proofing. In addition, metal powders, white pigments, fluorescent pigments, etc., are also employed. Examples of pigments preferably used include azo type, phthalocyanine type, anthraquinone type, dioxadiazine type, quinacrine type and isoindolinone type.

Pigments are usually dissolved and/or dispersed together with an organic binder in an organic solvent or an aqueous solvent. The pigment is ground into grains so that the colors and quality of image may be suitably reproduced. The average size of the grains is generally not more than 1 μm. Several examples of useful pigments and dyes known in the art are illustrated below. (C.I. means Color Index.)

Victoria Pure Blue (C.I. 42595)
Auramine (C.I. 41000)
Cathilon Brilliant Flavin (C.I. basic 13)
Rhodamine 6GCP (C.I. 45160)
Rhodamine B (C.I. 45170)
Safranine OK 70:100 (C.I. 50240)
Erioglaucine X (C.I. 42080)
Fast Black HB (C.I. 26150)
No. 1201 Lionol Yellow (C.I. 21090)
Lionol Yellow GRO (C.I. 21090)
Shimura-Fast Yellow 8GF (C.I. 21105)
Benzidine Yellow 4T-564D (C.I. 21095)
Shimura-Fast Red 4015 (C.I. 12355)
Lionol Red 7B 4401 (C.I. 15850)
Fastogen Blue TGR-L (C.I. 74160)
Lionol Blue SM (C.I. 26150)
Mitsubishi Carbon Black MN-100
Mitsubishi Carbon Black KA-100

Also usable are processed pigments in which fine pigment particles are dispersed in polymer carrier (available from Ciba-Geigy), for example, Microlith Yellow 4GA, Microlith Yellow 2R-A (C.I. 21108), Microlith Yellow MX-A (C.I. 21100), Microlith Blue 4G-A (C.I. 74160), Microlith Red 3R-A, Microlith Red 2C-A, Microlith Red 2B-A and Microlith Black C-A.

The ink layer contains at least one binder in order to control the fragility and the characters of film-formation. The binder not only controls the rheological character but also stabilizes the dispersed pigment. Thermoplastic resins are preferably used for such binder. Examples of such materials include chlorinated polyolefins such as chlorinated polyethylene and chlorinated polypropylene; cellulose derivatives such as methylcellulose, ethylcellulose and cellulose triacetate; homopolymers or copolymers of acrylic monomers such as acrylic acid, methacrylic acid, acrylate ester and methacrylate ester; styrene/anhydrous maleic acid resin and a half-ester of it; and poly(vinyl butyral).

The ratio between coloring matter and binder contained in the ink layer is determined in accordance with the combination of coloring matter and binder. Generally, the ratio of (coloring matter:binder) is in the range of 100:10-100:1000 (by weight).

The ink layer may contain, if desired, plasticizers in order to control the fragility and to enhance the adhesion between the ink layers having different colors. The plasticizer also enhances the efficiency of transferring of the ink layer onto the image-receiving sheet. The plasticizer used is determined in accordance with the combination of coloring matter and binder. Examples of the plasticizers include phthalate esters such as dibutyl phthalate (DBP), di-n-octyl phthalate (DnOP), di(2-ethylhexyl) phthalate (DOP), dinonyl phthalate (DNP), dilauryl phthalate (DLP), butyllauryl phthalate (BLP) and butylbenzyl phthalate (BBP); aliphatic dibasic acid esters such as di(2-ethylhexyl) adipate (DOA) and di(2-ethylhexyl) cebaciate (DOS); phosphate triester such as tricresyl phosphate (TCP) and tri(2-ethylhexyl) phosphate (TOP); polyol esters such as polyethyleneglycol ester; and epoxy compound such as epoxy aliphatic acid ester.

In addition to the above, also employable are acrylic esters such as polyethyleneglycol dimethacrylate, 1,2,4-butanetriol trimethacrylate, trimethyrolethane triacrylate, pentaerythrite tetracrylate and dipentaerythrite polyacrylate. These plasticizers can be used singly or in combination. A secondary plasticizer (auxiliary plasticizer) such as polyparaffin chloride may be used together with the above plasticizer.

The amount of the plasticizer added is determined according to the combination with coloring matter and binder. Generally, the ratio of (a total amount of coloring matter and binder:an amount of plasticizer) is in the range of 100:1–100:200, preferably 100:2–100:100 by weight.

The ink layer can contain various additives such as surfactant, viscosity increasing agent, dispersion stabilizer, adhesion promoter, etc.

The light-sensitive layer can be formed in a known manner. For example, the coloring matter, the binder and, if desired, other components such as the plasticizer are mixed and ground in a mill so that aimed size and color may be obtained. The prepared paste mixture is diluted with a solvent to prepare a coating composition of proper viscosity. The prepared coating composition is applied onto the support, and then applied layer is dried to form the ink layer. The thickness of the ink layer is below 10 μm, preferably within the range of about 0.1–100 μm.

A cover film (protective film) may be provided on the outer surface of the ink layer in order to protect the layer from mechanical damage. Examples of the materials for the protective film include polyethylene terephthalate (PET), polycarbonate, polyethylene, polypropylene, poly(vinyl chloride), poly(vinylidene chloride), polystyrene, and styrene-acrylonitrile copolymer. Polyethylene, polypropylene and polyethylene terephthalate are preferably used. The thickness of the protective film preferably is in the range of 5–400 μm, more preferably 10–200 μm. The surface of the ink layer side of the cover film may be subjected to the same surface treatment as that of the protective film on the light-sensitive layer of the light-sensitive material.

An image-receiving sheet is a sheet having an adhesive image-receiving surface which can receive the ink layer of the ink sheet. The image-receiving sheet comprises a support and an adhesive image-receiving layer provided thereon.

The support is not particularly restricted, and it may be made of any material. Examples of the materials of the support include polymer materials such as polyethylene terephthalate (PET), polycarbonate, triacetyl cellulose, polyethylene, polypropylene, polyvinyl chloride, poly(vinylidene chloride), polystyrene, and styrene-acrylonitrile copolymer. Particularly, biaxially oriented polyethylene terephthalate is preferred from the viewpoint of strength, dimensional stability, and thermostability. The thickness of the support generally is in the range of 5–400 μm, preferably 10–200 μm. In some cases, glass plates or metal plates can be used for the ink-receiving support.

An undercoating layer may be provided on the surface of the support or the surface may be physically coated in order to enhance adhesion between the support and the image-receiving layer. A film forming polymer material can be employed for the intermediate layer. The material is selected from the viewpoint of compatibility with other layers. The thickness of the undercoating layer is not restricted, but generally in the range of 0.01–2 μm. It is also preferred that the surface of the light-sensitive layer side of the support be subjected to physical surface treatment such as glow-discharge surface treatment and corona-discharge surface treatment.

The image-receiving layer preferably comprises an organic polymer of which softening point is not higher than 80° C. (determined by Vicat process). Further, the image-receiving layer preferably comprises photopolymerizable material, for example, disclosed in Japanese Patent Provisional Publication No. 59(1984)-97140. Such photopolymerizable material improves anti-scratch character and anti-adhesion character during storage.

A particularly preferred image-receiving layer comprises:
(a) at least one photopolymerizable monomer and/or oligomer capable of forming a photopolymer by addition polymerization;
(b) at least one organic polymer binder; and
(c) a photopolymerization initiator activated by actinic light; and if desired or necessary,
(d) additives such as a thermalpolymerization inhibitor and surfactant.

As the above-described photopolymerizable monomer and/or oligomer, the photopolymerizable monomers and/or oligomers for the light-sensitive layer of the light-sensitive described above can be used (multifunctional vinyl or vinylidene compounds are particularly preferable).

As the above-described organic polymer binder, the organic polymer binders for the light-sensitive layer of the light-sensitive described above can be used.

As the above-described initiator, the initiators for the light-sensitive layer of the light-sensitive described above can be used. In view of color reproductivity, it is preferred that the initiator preferably be a compound showing small or no absorption within a visible region. The mixing ratio between the photopolymerizable monomer (or oligomer) and the organic polymer binder depends on the combination of them, but generally it is in the range of 0.1:1.0–2.0:1.0 (photopolymerizable monomer:binder by weight). The photopolymerization initiator is generally contained in the range of 0.01–20 wt. % based on the amount of the photopolymerizable monomer. The image-receiving layer can be formed in a known manner. For example, a coating dispersion containing the above-mentioned components is coated on the support, and then coated layer is dried to form the image-receiving layer. The image-receiving layer is transformed while the ink layer is pressed onto the image-receiving layer, and therefore the image-receiving layer preferably has an appropriate thickness to receive the ink layer. The proper amount of applied photopolymerizable material depends on the thickness of the ink layer, but generally it is in the range of 2–50 g/m².

The image-receiving layer may consist of two layers, if desired. When the image formed on such image-receiving layer is transferred onto a permanent support such as printing paper, the upper layer is transferred together with the image and the lower layer (support side) remains on the image-receiving sheet. Such printing process is disclosed in detail in Japanese Patent Provisional Publications No. 61(1986)-189535, No. 2(1990)-244146, No. 2(1990)-244147 and No. 2(1990)-244148. Since this process is preferable from the viewpoint of approximation to the printing, the image-receiving layer preferably consists of two layers.

Each step of the image forming is described below in more detail.

The imagewise exposure to actinic light can be carried out in a known manner. Examples of actinic light include laser light and UV light emitted from mercury light or xenon lamp. UV light is irradiated through an image mask to perform the imagewise exposure. In the case that laser light is used as actinic light, the condensed light modulated in accordance with image signal scans the light-sensitive layer. In such case, imagewise exposure can be carried out in accordance with digital data provided from an image processing system.

The development can be carried out in a known manner using a suitably selected developing agent. The developing agent is determined from the viewpoint of constitution of the light-sensitive material and desired constitution of ink-repelling area and ink-receiving area. A suitable developing agent can be easily chosen from known agents according to the above description.

The ink sheet is then placed on the material having the ink-receiving area and the ink-repelling area in such manner that the ink layer of the ink sheet can be in face-to-face contact with the surface of the light-sensitive material on which the ink-receiving area and the ink-repelling area are provided, and then the ink sheet and the material are pressed, if necessary with heating, to prepare a piled composition consisting of the ink sheet and the material. The heating temperature is generally up to 160° C., preferably room temperature −130° C. The pressure is generally in the range of 0.5–100 kg/cm$^2$ (gauge pressure), preferably 1–10 kg/cm$^2$ (gauge pressure). It is generally carried out that a composite of the ink sheet and the material be made to pass through a laminator.

The ink sheet is then peeled off so that the ink layer is transferred on the material only in the ink-receiving area.

Subsequently, the image-receiving sheet is placed on the material having thereon the ink layer in the ink-receiving area in such manner that the ink-receiving surface of the image-receiving sheet can be in face-to-face contact with the surface of the material on which the ink layer image has been formed, and then the image-receiving sheet and the material are pressed, if necessary with heating, to prepare a composite consisting of the image-receiving sheet and the material. The conditions and manners in this step are the same as those described above.

Then, the image-receiving sheet is peeled off so that the ink layer image is transferred onto the image-receiving sheet.

In the above-described image forming process, an important matter is the correlation of the following forces: a bonding force between the ink-receiving area of the material and the ink layer (F1); a bonding force between the ink-repelling area of the material and the ink layer (F2); a bonding force between the ink layer and the support (F3); a bonding force between the ink layer and the ink-receiving surface of the image-receiving sheet (F4); and a cohesive force of the ink layer. (F5). Each of F1–F5 depends on the procedure of all steps, and therefore the correlation of F1–F5 cannot be uniquely determined. However, so long as the ink layer behaves as described above in each step, the desired image is formed. A suitable combination of the light-sensitive material, the ink sheet and the image-receiving sheet can be easily determined according to the above description.

A multi-color image can be formed on the image-receiving sheet in the following manner. Two or more ink sheets having different color ink layers are beforehand prepared. Each ink sheet and a light-sensitive material are processed to obtain the material on which the ink layer image of each color is formed. Thus obtained two or more materials, each of which has a different color image, are processed in the following steps using the same image-receiving sheet. Two or more ink layers of different colors are superposably transferred onto the image-receiving sheet to form a multi-color image.

The colors of ink layers are not restricted. In the case that a full-color image is desired to be formed, colors of yellow, magenta, cyan and black are generally used. The color of ink layer is freely prepared by selecting coloring matters or by adjusting the content.

For example, a multi-color image can be formed in the following manner. First, an image of a certain color AA (for example, yellow) obtained from color separation is projected on the light-sensitive layer by exposure. Then, an ink sheet having color AA is combined to obtain the material AA on which the image of color AA is formed. With the obtained material AA, an image of color AA is formed on the ink-receiving surface (image-receiving layer) of the image-receiving sheet.

Subsequently, as for color BB which is different from color AA, the procedure for color AA is repeated except for using an ink sheet having color BB to obtain the material BB on which the image of color BB is formed. Using the obtained material BB and the image-receiving sheet on which the image of color AA has been already formed, the image of color BB is overlaid on the image-receiving layer.

As for color CC which is different from colors AA and BB, the procedure for color BB is repeated to overlay the image of color CC on the image-receiving layer on which the images of colors AA and BB have been already formed.

As for other colors, the same procedure is repeated to form a multi-color image on the image-receiving layer of the image-receiving sheet. If colors of yellow, magenta, cyan and black are used, a full-color image is formed.

The condition of developing and transferring the image of each color is preferably set the same in view of avoiding handling error and improving the efficiency of process.

The second embodiment of the invention is described below.

The second embodiment differs from the aforementioned first embodiment in the use of a resist ink and in the procedure in which the resist ink is hardened (cured) in the step where the image-receiving sheet and the material having the resist ink thereon in the resist ink-receiving layer are combined.

The resist ink layer preferably comprises UV-setting ink material mainly consisting of photopolymerizable materials because of the following reasons. The adhesion character of such layer can be easily adjusted, and therefore such layer can be fixed on the support with proper adhesion. Further, such layer gives an improved resist image and is not made adhesive by post exposure performed after transferring of the ink layer.

Known materials can be used for the UV-setting ink material. Generally used is a material comprising a prepolymer/monomer as film-forming component, a photopolymerization initiator as catalyst, a polymerization inhibitor as auxiliary agent and wax. Examples of the UV-setting ink material are the same as the materials of the light-sensitive layer of the first embodiment described above. Further, the UV-setting ink material may contain colorants such as dyes and pigments described in the first embodiment.

Hardening of the resist ink can be done in a known manner.

EXAMPLES

The following examples further illustrate the invention in detail, but not restrict the invention.

Example 1

1) Preparation of a Light-sensitive Material

A negative light-sensitive solution of the following contents was coated on biaxially oriented polyethylene terephthalate film of 100 μm thick (ink-receiving support) by means of a whirler, and then dried to prepare light-sensitive layer of 1 μm thick.

| Contents of negative light-sensitive solution | (weight parts) |
|---|---|
| Pentaerythritol tetramethacrylate | 43.2 |
| Copolymer of benzyl methacrylate and methacrylic acid (molar ratio 73:27; [η] 25° C. in methyl ethyl ketone = 0.12) | 60.0 |
| Michler's ketone | 0.41 |
| Benzophenone | 2.54 |
| p-Methoxyphenol | 0.12 |
| Methyl ethyl ketone | 680.0 |
| Methyl cellosolve acetate | 120.0 |

The solution for preparing an ink-repelling layer of the following contents was coated on the light-sensitive layer prepared above by means of a whirler, and then dried at 120° C. for 2 minutes to prepare ink-repelling layer of 1 μm thick.

| Contents of the solution for coating ink-repelling layer | (weight parts) |
|---|---|
| Silicone rubber of condensation type (YE-3085 available from Toshiba Silicone Co., Ltd.) | 10.0 |
| Silane coupling agent (KBE-903 available from Toshiba Silicone Co., Ltd.) | 0.2 |
| n-Heptane | 100.0 |

Polypropylene film of 10 μm thick was laminated on the prepared ink-repelling; layer by means of a laminator to prepare a light-sensitive material.

2) Preparation of Ink Sheets

Yellow (Y), magenta (M), cyan (C) and black (B) color ink sheets were prepared. The solution for coating each ink layer of the following contents was coated on each bi-axially oriented polyethylene terephthalate film (PET) of 25 μm thick by means of a whirler, and then dried to prepare ink layer of 2.0 μm thick. Thus, each color ink sheet was prepared.

| Contents of the solution for coating yellow ink layer | (weight parts) |
|---|---|
| A copolymer of benzylmethacrylate and methacrylic acid (molar ratio 73:27; [η] 25° C. in methyl ethyl ketone = 0.12) | 45.0 |
| Pentaerythritol tetramethacrylate | 43.2 |
| 2-(o-Chlorophenyl)-4,5-diphenylimidazole dimer | 2.5 |
| Seika first yellow H-0755 (available from Dainichi Seika Kogyo Co., Ltd.) | 9.4 |
| Methyl cellosolve acetate | 560 |
| Methyl ethyl ketone | 280 |

Contents of the Solution for Coating Magenta Ink Layer

The solution for coating magenta ink layer contained the components of the solution for coating yellow ink layer except for containing 5.2 weight part of Seika first carmine 1483 (available from Dainichi Seika Kogyo Co., Ltd.) instead of 9.4 weight parts of Seika first yellow H-0755.

Contents of the Solution for Coating Cyan Ink Layer

The solution for coating cyan ink layer contained the components of the solution for coating yellow ink layer except for containing 5.6 weight parts of Cyan blue (available from Dainichi Seika Kogyo Co., Ltd.) instead of 9.4 weight parts of Seika first yellow H-0755.

Contents of the Solution for Coating Black Ink Layer

The solution for coating black ink layer contained the components of the solution for coating yellow ink layer except containing 6.6 weight part of Mitsubishi Carbon Black KA-100 (available from Mitsubishi Chemical Industries, Ltd.) instead of 9.4 weight parts of Seika first yellow H-0755.

3) Yellow Color Separation Image—Initial Stage

The surface of the ink-repelling layer of the light-sensitive material was superposed on a yellow color separation mask, exposed to a light from 2 kw super high-pressure mercury lamp spaced at a distance of 50 cm therefrom, then developed at 35° C. for 1 minute using a developing solution of the following components to remove the non-exposed area of the light-sensitive layer and the ink-repelling layer provided thereon in a body. Thus the ink-receiving area (the surface of the support) and the ink-repelling area (the surface of the ink-repelling layer) were formed on the support to reproduce the image of the yellow color separation mask.

| Contents of the developing solution | (weight parts) |
|---|---|
| Diethyleneglycol mono n-hexyl ether | 5.0 |
| Triethanol amine | 1.0 |
| Pelex NBL (available from Kao Atlas Co.) (nonionic type surfactant, 35% solution) | 5.0 |
| Water | 89.0 |

4) Yellow Color Separation Image—Middle Stage

The yellow ink sheet was placed on the light-sensitive material prepared in the above 3) so that the ink layer might be brought into contact with the surface on which the ink-receiving area and the ink-repelling area had been formed in the above 3), and then the ink sheet and the material were passed through a laminator (Fuji color art laminator CA-680T3; Temperature 125° C., Pressure 4.5 kg/cm²) at the rate of 900 mm/minute to prepare a composite body. After cooling to room temperature, the composite body was separated from each other to obtain the material on which the image of yellow ink was formed on the ink-receiving area.

Yellow Color Separation Image—Last Stage

The image-receiving sheet (Fuji color art image-receiving film CR-T4) was placed on the light-sensitive material prepared in the above 4) so that the image-receiving surface could be brought into contact with the surface on which the image had been formed in the above 4), and then the image-receiving sheet and the material were passed through a laminator (Fuji color art laminator CA-680T3; Temperature 125° C., Pressure 4.5 kg/cm²) at the rate of 900 mm/minute to prepare a composite body. After cooling to room temperature, the composite body was separated from each other to obtain the image-receiving sheet on which the image of yellow ink was formed.

6) Magenta Color Separation Image—Initial and Middle Stages

The procedures of yellow color separation image was repeated except using the magenta ink sheet instead of the yellow ink sheet to prepare the material on which the image of magenta ink was formed on the ink-receiving area.

7) Magenta Color Separation Image Last Stage

The procedure of the last step for the preparation of the yellow color separation image was repeated except for using the material on which the image of the magenta ink layer had been formed in above 6) and the image-receiving sheet on which the image of the yellow ink had been formed in the above 5). Thus prepared was the image-receiving sheet on which the image of yellow ink and magenta ink was formed.

8) Cyan Color Separation Image—Initial and Middle Stage

The procedure for the preparation of the yellow color separation image was repeated except for using the cyan ink sheet instead of the yellow ink sheet to prepare the material on which the image of cyan ink was formed on the ink-receiving area.

9) Cyan Color Separation Image—Last Stage

The procedure of the last step described in 5) above was repeated except for using the material on which the image of the cyan ink had been formed in 8) above and the image-receiving sheet on which the images of the yellow ink and the magenta ink had been formed in 7) above. Thus prepared was the image-receiving sheet on which the image of yellow ink, magenta ink, and cyan ink was formed.

10) Black Color Separation Image—Initial and Middle Stage

The procedure of for the preparation of black color separation image was repeated except for using the black ink sheet instead of the yellow ink sheet to prepare the material on which the image of black ink was formed on the ink-receiving area.

11) Black Color Separation Image—Last Stage

The procedure of the last step described in 5) above was repeated except for using the material on which the image of the black ink layer had been formed in above 10) and the image-receiving sheet on which the image of the yellow ink layer, the magenta ink layer and the cyan ink layer had been formed in above 9). Thus prepared was the image-receiving sheet on which the image of yellow ink, magenta ink, cyan ink and black ink was formed.

12) Preparation of Color Proofing Sheet

The four-color ink image prepared in the above 11) was transferred together with the ink-receiving layer of the image-receiving sheet onto printing paper to prepare a color proof sheet.

With respect to each color, the middle and last stages were repeated ten times using the material on which the ink-receiving area and the ink-repelling area were formed corresponding to each color separation image. Thus ten color proof sheets for each color were prepared from one light-sensitive material.

EXAMPLE 2

1) Preparation of a Light-sensitive Material

The solution for coating ink-repelling layer of the following contents was coated on biaxially oriented polyethylene terephthalate film of 100 μm thick (support) by means of a whirler, and then dried to prepare ink-repelling layer of 1 μm thick.

| Contents of the solution for coating ink-repelling layer | |
|---|---|
| | (weight parts) |
| Ionomer resin (Chemipal S-100 available from Mitsui Petrochemical) | 150.0 |
| Sodium dioctylsulfosuccinate (Lapizole B-80) | 0.5 |
| Water | 850.0 |

The positive light-sensitive solution of the following contents was coated on the ink-repelling layer prepared above by means of a whirler, and then dried to prepare light-sensitive layer of 1 μm thick. Thus, the light-sensitive material was prepared.

| Contents of positive light-sensitive solution | |
|---|---|
| | (weight parts) |
| Adduct of acetone-pyrogallol condensate (average polymerization degree: 3) and 2-diazol-naphthol-4-sulfonyl chloride | 6.0 |
| Novolak type phenol/formaldehyde resin (available from Sumitomo Dures Co., Ltd.; PR-50904) | 9.0 |
| Methyl ethyl ketone | 50.0 |
| Methyl cellosolve acetate | 50.0 |

2) The procedure of Example 1 was repeated except using the light-sensitive material prepared above instead of that of Example 1. Thus color proof sheets were prepared. In this example, the ink-receiving area of the light-sensitive layer and the ink-repelling area of the ink-repelling layer were utilized.

EXAMPLE 3

1) Initial Stage

After a glass plate of 2.0 mm thick (30 cm×40 cm) was washed, the surface was treated with 3% aqueous solution of aminosilane coupling agent (KBM-603, available from Shin-Etsu Silicone Co., Ltd.). Onto the resulting surface, the light-sensitive solution of the following components was coated and dried to form a light-sensitive layer of 0.8 μm thick.

| Contents of light-sensitive solution | |
|---|---|
| | (weight parts) |
| Adduct of acetone-pyrogallol condensate (average polymerization degree: 3) and 2-diazol-naphthol-4-sulfonyl chloride | 0.8 |
| Novolak type phenol/formaldehyde resin (available from Sumitomo Dures Co., Ltd.; PR-50904) | 2.0 |
| Methyl ethyl ketone | 15.0 |
| Methyl cellosolve acetate | 15.0 |

The obtained light-sensitive layer on the glass plate was exposed through a mask, and then developed to form a fine pattern on the plate. Subsequently, 5% n-heptane solution of a hardening type silicone rubber (YE3085, available from Toshiba silicone Co., Ltd.) was coated on the formed pattern so that the thickness of the dried film might become 0.9 μm. After burning at 120° C. for 15 minutes, the glass plate was soaked in γ-butyrolactone for 1 minute and then the silicone rubber layer was carefully wiped with soft sponge. By this wiping, the relief image formed of quinondiazide was removed together with silicone rubber provided thereon in a body, and therefore the reverse relief image was formed of silicone rubber of 0.9 μm thick on the glass plate. Thus prepared is the glass plate on which the resist ink-receiving area of glass and the resist ink-repelling area of silicone rubber were formed. The obtained plate is hereinafter referred to as "master plate".

2) Middle Stage

The solution for coating resist ink layer of the following contents was coated on a polyester film of 25 μm, and then dried to prepare a resist ink layer of 1.1 μm thick. Thus, an ink sheet was prepared.

| Contents of the solution for coating resist ink layer | |
| --- | --- |
| | (weight parts) |
| Polymethyl methacrylate | 10.0 |
| Pentaerythritol tetramethacrylate | 11.0 |
| Michler's ketone | 0.6 |
| 2-(o-Chlorophenyl)-4,5-diphenylimidazole dimer | 0.8 |
| Methyl cellosolve acetate | 150 |
| Methyl ethyl ketone | 150 |

The ink sheet was placed on the master plate so that the resist ink layer of the ink sheet could be brought into contact with the surface of the master plate on which the resist ink image had been formed, and then the sheet and the plate were pressed to make a composite body. Subsequently, the composite body was separated to obtain the master plate on which the resist ink was transferred only onto the appearing portion of glass surface. Thus prepared was the master plate on which a resist ink image was formed.

3) Final Stage

On the surface of a glass plate of 1.1 mm thick (30 cm×40 cm), vacuum deposited chromium layer (ink layer-receiving layer) of 100 nm thick was provided. The obtained plate was used as a image-receiving sheet.

Thus obtained image-receiving sheet was placed on the master plate on which the image of resist ink had been formed in the above 2) so that the resist ink layer could be brought into contact with the deposited chromium layer, and then the resist ink was exposed to UV light through the glass plate (support of the master plate) to be hardened. Subsequently, the image-receiving sheet and the master plate were separated from each other. The resist ink was found to be completely transferred onto the image-receiving layer.

4) The deposited chromium layer of the image-receiving sheet obtained in the above 3) was etched in an ordinary manner. The pattern of 3 μm was reproduced.

The above procedures 2)–4) were repeated 100 times using only one master plate obtained above. All of thus obtained pattern images of chromium showed excellent quality.

As is described above, in the image forming process of the invention, no water is used, and hence emulsifying of ink can be avoided. Further, the problem of bubbles formed in ink, which is difficult to solve in conventional process using liquid inks, can be completely solved by the invention. As for transferring of ink, the materials can be chosen in view of their characters so that the ink layer can be well transferred without formation of bubbles onto image area. For example, the attaching or detaching ability between the ink layer and the ink-receiving and -repelling area of the light-sensitive material is controlled. In addition to those, since the light-sensitive material used in the present invention is a lithographic plate, the sharpness of the edge of the transferred image is high.

In particular, the first embodiment is suitable for the preparation of color proof sheets, and the second embodiment is useful in the field of electronics industries, in which fine circuit printing technology is required.

We claim:

1. An image-forming process comprising the steps of:
   forming an ink-receiving area and an ink-repelling area on a light-sensitive material by imagewise exposing the material to actinic light or by imagewise exposing the material to actinic light and developing the exposed material;
   placing under pressure on the ink-receiving area and ink-repelling area of the material an ink sheet comprising a support and an ink layer composed of a colorant and a polymer binder under the condition that the ink layer is brought into contact with the ink-receiving area and the ink-repelling area of the material;
   removing the ink sheet from the material so that the ink layer of the ink sheet is transferred only onto the ink-receiving area of the material;
   placing under pressure an image receiving sheet on the ink-receiving area having the ink layer therein and the ink-repelling layer of the material; and
   separating the image receiving sheet from the material so that the ink layer in the ink-receiving area is transferred onto the image receiving sheet.

2. The image-forming process as defined in claim 1, wherein the step of forming an ink-receiving area and an ink-repelling area is performed by imagewise exposing a light-sensitive material comprising a support having an ink-repellent surface and a light-sensitive layer having an ink-receiving surface to actinic light and developing the exposed material so that an ink-receiving resin layer formed of hardening of the light-sensitive layer remains on the support only in the exposed area.

3. The image-forming process as defined in claim 1, wherein the step of forming an ink-receiving area and an ink-repelling area is performed by imagewise exposing a light-sensitive material comprising a support having an ink-receiving surface, a light-sensitive layer, and a coating layer having an ink-repellent surface, to actinic light and developing the exposed material so that a resin layer formed of hardening of the light-sensitive layer on which the ink-repelling coating layer is coated remains on the support only in the exposed area.

4. The image-forming process as defined in claim 1, wherein the step of forming an ink-receiving area and an ink-repelling area is performed by imagewise exposing a light-sensitive material comprising a support, a subbing layer having an ink repellent surface, and a light-sensitive layer having an ink receiving surface, to actinic light and developing the exposed material so that an ink receiving resin layer formed of hardening of the light-sensitive layer remains on the ink-repellent subbing layer only in the exposed area.

5. The image-forming process as defined in claim 1, wherein the step of forming an ink-receiving area and an ink-repelling area is performed by imagewise exposing a light-sensitive material comprising a support having an ink-receiving surface and a light-sensitive layer having an ink-repellent surface, to actinic light and developing the exposed material so that an ink-repellent resin layer formed of hardening of the light-sensitive layer remains on the support only in the exposed area.

6. The image-forming process as defined in claim 1, wherein the step of forming an ink-receiving area and an ink-repelling area is performed by imagewise exposing a light-sensitive material comprising a support, a subbing layer having an ink-receiving surface, and a light-sensitive layer having an ink-repellent surface, to actinic light and developing the exposed material so that an ink-repellent resin layer formed of hardening of the light-sensitive layer remains on the ink-receiving subbing layer only in the exposed area.

7. An image-forming process comprising the steps of:
   forming a resist ink-receiving area and a resist ink-repelling area on a light-sensitive material by imagewise exposing the material to actinic light or by imagewise exposing the material to actinic light and developing the exposed material;
   placing under pressure on the resist ink-receiving area and resist ink-repelling area of the material a resist ink sheet comprising a support and an resist ink layer under the condition that the resist ink layer is brought into contact with the resist ink-receiving area and the resist ink-repelling area of the material;
   removing the resist ink sheet from the material so that the resist ink layer of the resist ink sheet is transferred only onto the resist ink-receiving area of the material;
   placing under pressure an image receiving sheet on the resist ink-receiving area having therein the resist ink layer and the resist ink-repelling layer of the material;
   exposing the image receiving sheet and the material to actinic light so that the resist ink layer on the resist ink-receiving area is hardened; and
   separating the image receiving sheet from the material so that an image of the hardened resist ink is formed on the image receiving sheet.

8. The image-forming process as defined in claim 7, wherein the step of forming a resist ink-receiving area and a resist ink-repelling area is performed by imagewise exposing a light-sensitive material comprising a support having a resist ink-repellent surface and a light-sensitive layer having a resist ink-receiving surface to actinic light and developing the exposed material so that a resist ink-receiving resin layer formed of hardening of the light-sensitive layer remains on the support only in the exposed area.

9. The image-forming process as defined in claim 7, wherein the step of forming a resist ink-receiving area and a resist ink-repelling area is performed by imagewise exposing a light-sensitive material comprising a support having a resist ink-receiving surface, a light-sensitive layer, and a coating layer having a resist ink-repellent surface, to actinic light and developing the exposed material so that a resin layer formed of hardening of the light-sensitive layer on which the resist ink-repellent coating layer is coated remains on the support only in the exposed area.

10. The image-forming process as defined in claim 7, wherein the step of forming a resist ink-receiving area and a resist ink-repelling area is performed by imagewise exposing a light-sensitive material comprising a support, a subbing layer having a resist ink-repellent surface, and a light-sensitive layer having a resist ink-receiving surface, to actinic light and developing the exposed material so that a resist ink-receiving resin layer formed of hardening of the light-sensitive layer remains on the resist ink-repellent subbing layer only in the exposed area.

11. The image-forming process as defined in claim 7, wherein the step of forming a resist ink-receiving area and a resist ink-repelling area is performed by imagewise exposing a light-sensitive material comprising a support having a resist ink-receiving surface and a light-sensitive layer having a resist ink-repellent surface, to actinic light and developing the exposed material so that a resist ink-repellent resin layer formed of hardening of the light-sensitive layer remains on the support only in the exposed area.

12. The image-forming process as defined in claim 7, wherein the step of forming a resist ink-receiving area and a resist ink-repelling area is performed by imagewise exposing a light-sensitive material comprising a support, a subbing layer having a resist ink-receiving surface, and a light-sensitive layer having a resist ink-repellent surface, to actinic light and developing the exposed material so that a resist ink-repellent resin layer formed of hardening of the light-sensitive layer remains on the resist ink-receiving subbing layer only in the exposed area.

* * * * *